(12) United States Patent
Cong et al.

(10) Patent No.: US 12,077,880 B2
(45) Date of Patent: Sep. 3, 2024

(54) IN-SITU FILM GROWTH RATE MONITORING APPARATUS, SYSTEMS, AND METHODS FOR SUBSTRATE PROCESSING

(71) Applicant: Applied Materials, Inc., Santa Clara, CA (US)

(72) Inventors: Zhepeng Cong, San Jose, CA (US); Nyi Oo Myo, San Jose, CA (US); Tao Sheng, Santa Clara, CA (US); Yong Zheng, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 523 days.

(21) Appl. No.: 17/243,158

(22) Filed: Apr. 28, 2021

(65) Prior Publication Data

US 2022/0349088 A1 Nov. 3, 2022

(51) Int. Cl.
*C30B 25/16* (2006.01)
*C23C 14/50* (2006.01)
(Continued)

(52) U.S. Cl.
CPC ............. *C30B 25/16* (2013.01); *C23C 14/50* (2013.01); *C23C 14/541* (2013.01);
(Continued)

(58) Field of Classification Search
CPC ..... C30B 25/16; C30B 23/002; C30B 23/063; C30B 25/10; C30B 25/12; C23C 14/547;
(Continued)

(56) References Cited

U.S. PATENT DOCUMENTS

| 4,203,799 A | 5/1980 | Sugawara et al. |
| 4,812,650 A | 3/1989 | Eckstein et al. |

(Continued)

FOREIGN PATENT DOCUMENTS

| WO | 2004102307 A2 | 11/2004 |
| WO | 2005071134 A1 | 8/2005 |

OTHER PUBLICATIONS

Springthorpe, A. J., et al., "In situ growth rate measurements during molecular beam epitaxy using an optical byrometer", Applied Physics Letters, vol. 55, Issue 20, Jun. 4, 1998, Abstract, https://aip.scitation.org/doi/pdf/10.1063/1.102082, Last accessed Mar. 16, 2021.

(Continued)

*Primary Examiner* — Michelle M Iacoletti
*Assistant Examiner* — Judy Dao Tran
(74) *Attorney, Agent, or Firm* — Patterson + Sheridan, LLP

(57) ABSTRACT

Embodiments of the present disclosure generally relate to apparatus, systems, and methods for in-situ film growth rate monitoring. A thickness of a film on a substrate is monitored during a substrate processing operation that deposits the film on the substrate. The thickness is monitored while the substrate processing operation is conducted. The monitoring includes directing light in a direction toward a crystalline coupon. The direction is perpendicular to a heating direction. In one implementation, a reflectometer system to monitor film growth during substrate processing operations includes a first block that includes a first inner surface. The reflectometer system includes a light emitter disposed in the first block and oriented toward the first inner surface, and a light receiver disposed in the first block and oriented toward the first inner surface. The reflectometer system includes a second block opposing the first block.

8 Claims, 8 Drawing Sheets

(51) Int. Cl.
    *C23C 14/54*     (2006.01)
    *C23C 16/458*     (2006.01)
    *C23C 16/46*     (2006.01)
    *C23C 16/52*     (2006.01)
    *C30B 23/00*     (2006.01)
    *C30B 23/06*     (2006.01)
    *C30B 25/10*     (2006.01)
    *C30B 25/12*     (2006.01)
    *G01N 21/55*     (2014.01)
    *B41J 2/16*     (2006.01)
    *G01B 11/06*     (2006.01)
    *H01L 21/02*     (2006.01)
    *H01L 21/66*     (2006.01)
    *H01L 21/67*     (2006.01)

(52) U.S. Cl.
    CPC ........ *C23C 14/547* (2013.01); *C23C 16/4583* (2013.01); *C23C 16/46* (2013.01); *C23C 16/52* (2013.01); *C30B 23/002* (2013.01); *C30B 23/063* (2013.01); *C30B 25/10* (2013.01); *C30B 25/12* (2013.01); *G01N 21/55* (2013.01); *B01J 2219/00443* (2013.01); *B41J 2/1642* (2013.01); *G01B 11/0625* (2013.01); *G01N 2201/062* (2013.01); *H01L 21/02266* (2013.01); *H01L 21/02271* (2013.01); *H01L 21/67253* (2013.01); *H01L 22/12* (2013.01); *H01L 22/26* (2013.01)

(58) Field of Classification Search
    CPC ..... C23C 16/4583; C23C 16/46; C23C 16/52; G01N 21/55; G01N 2021/8416; G01N 21/8422; B01J 2219/00443; B41J 2/1642; G01B 11/0625; H01L 21/02266; H01L 21/02271; H01L 21/67253; H01L 22/12; H01L 22/26
    See application file for complete search history.

(56) References Cited

U.S. PATENT DOCUMENTS

| | | |
|---|---|---|
| 8,822,248 B2 | 9/2014 | Park |
| 10,134,569 B1 | 11/2018 | Albarede et al. |
| 2004/0067370 A1* | 4/2004 | Ebata ............... H01L 22/34 |
| | | 257/E21.53 |
| 2006/0185588 A1 | 8/2006 | Nozawa et al. |
| 2018/0010243 A1* | 1/2018 | Lee ................. H01L 21/78 |
| 2018/0090303 A1* | 3/2018 | Yoon ............... G01N 29/12 |
| 2019/0287845 A1* | 9/2019 | Wu ................. H01L 21/67115 |
| 2020/0075899 A1* | 3/2020 | Kim ................. H10K 71/60 |
| 2022/0326264 A1* | 10/2022 | Eckman ............ G01N 35/1074 |

OTHER PUBLICATIONS

International Search Report and Written Opinion dated May 2, 2022 for Application No. PCT/US2022/013259.

* cited by examiner

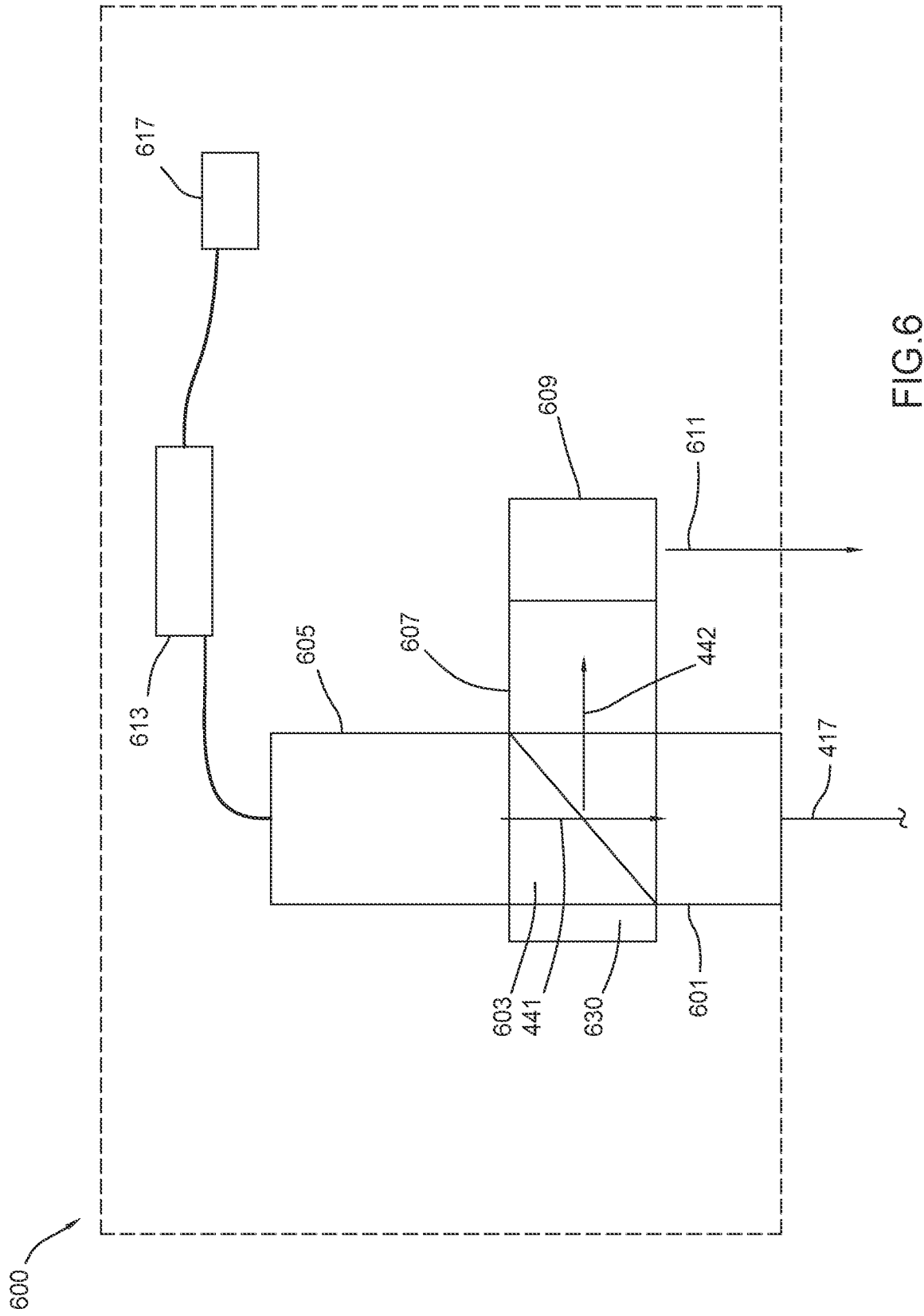

1 …

IN-SITU FILM GROWTH RATE MONITORING APPARATUS, SYSTEMS, AND METHODS FOR SUBSTRATE PROCESSING

BACKGROUND

Field

Embodiments of the present disclosure generally relate to apparatus, systems, and methods for in-situ film growth rate monitoring.

Description of the Related Art

Film thickness measurements of a processed substrate can be used in relation to processing operations. The film thickness measurements can be taken outside of a process chamber in which the processed substrate is processed, after the processing operations are conducted. Such measurement determinations can involve inefficiencies and reduced throughput as substrates which do not meet specifications may not be used, and it can take several processing iterations to obtain measurements that meet specifications.

Additionally, it is difficult to conduct film thickness measurements within the process chamber and during the processing operations because processing equipment in the process chamber can interfere with measurement equipment, thereby hindering measurement accuracy. For example, heat emitted from heat lamps can interfere with measurement equipment. As another example, windows (such as coatings on domes) in a processing chamber can interfere with measurement equipment.

Therefore, there is a need for improved apparatus, systems, and methods that facilitate in-situ and real-time measurement operations, accurate measurements, increased efficiency and throughput, reduced machine downtime, and reduced costs.

SUMMARY

Embodiments of the present disclosure generally relate to apparatus, systems, and methods for in-situ film growth rate monitoring. A thickness of a film on a substrate is monitored during a substrate processing operation that deposits the film on the substrate. The thickness is monitored while the substrate processing operation is conducted. The monitoring includes directing light in a direction toward a crystalline coupon. The direction is perpendicular to a heating direction.

In one implementation, a reflectometer system to monitor film growth during substrate processing operations includes a first block that includes a first inner surface. The reflectometer system includes a light emitter disposed in the first block and oriented toward the first inner surface, and a light receiver disposed in the first block and oriented toward the first inner surface. The reflectometer system includes a second block opposing the first block. The second block includes a second inner surface facing the first inner surface. The reflectometer system includes a first connector bar and a second connector bar separating the first block and the second block.

In one implementation, a system for processing substrates includes a process chamber that includes a process volume, a susceptor disposed in the process volume, and a plurality of lamps. The plurality of lamps are configured to generate heat along a Z-axis toward the susceptor. The system includes a pre-heat ring supported on a sidewall of the process chamber, and a reflectometer system. The reflectometer system includes a first block disposed in the process volume. The first block includes a first inner surface. The reflectometer system includes a light emitter disposed in the first block and oriented toward the first inner surface, and a light source coupled to the light emitter. The reflectometer system includes a light receiver disposed in the first block and oriented toward the first inner surface, and a sensor coupled to the light receiver. The reflectometer system includes a second block disposed in the process volume and opposing the first block in an X-Y plane that is perpendicular to the Z-axis. The second block includes a second inner surface facing the first inner surface.

In one implementation, a non-transitory computer readable medium includes instructions that, when executed, cause conducting a substrate processing operation on a substrate supported on a susceptor disposed in a process volume of a process chamber. The substrate processing operation includes flowing one or more process gases into the process volume, and heating the substrate. The instructions—when executed—cause, while conducting the substrate processing operation, directing light from a light emitter disposed in a first block toward a crystalline coupon. The instructions, when executed, cause collecting reflected light that is reflected off of the crystalline coupon, and determining a growth rate of the crystalline coupon using the reflected light.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 6 is a schematic plan view of an optical module, according to one implementation.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus, systems, and methods for in-situ film growth rate monitoring. A thickness of a film on a substrate is monitored during a substrate processing operation that deposits the film on the substrate. The thickness is monitored while the substrate processing operation is conducted. The monitoring includes directing light in a direction toward a crystalline coupon. The direction is perpendicular to a heating direction.

The disclosure contemplates that terms such as "couples," "coupling," "couple," and "coupled" may include but are not limited to welding, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling. The disclosure contemplates that terms such as "couples," "coupling," "couple," and "coupled" may include operable coupling such as electric coupling and/or fluidly coupling.

Figure 1A:
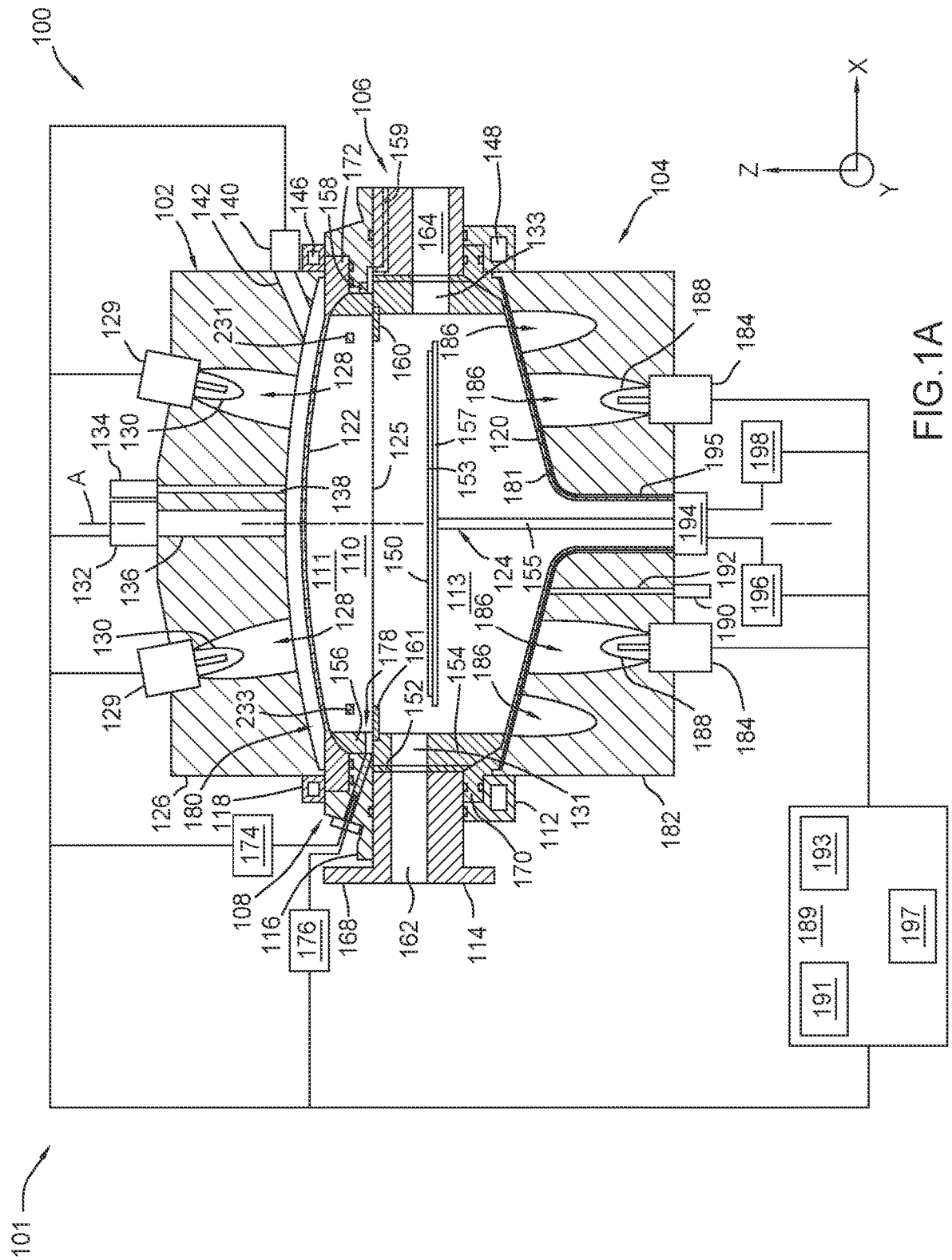
FIG. 1A is a schematic cross-sectional view of a system for processing substrates, according to one implementation.

FIG. 1A is a schematic cross-sectional view of a system 101 for processing substrates, according to one implementation. The system 101 includes a process chamber 100. The process chamber 100 is an epitaxial deposition chamber and may be used as part of a cluster tool. The process chamber 100 is utilized to grow an epitaxial film on a substrate, such as the substrate 150. The process chamber 100 creates a cross-flow of precursors (e.g., process gases) across the top surface of the substrate 150 during processing. The system 101 uses a process chamber 100 configured to conduct an epitaxial deposition operation on the substrate 150. The aspects and benefits of the present disclosure can be used for other substrate processing operations, such as in chemical vapor deposition (CVD) chambers, atomic layer deposition (ALD) chambers, physical vapor deposition (PVD) chambers, etch chambers, ion implantation chambers, oxidation chambers, and/or other processing chambers.

The process chamber 100 includes an upper lamp module 102, a lower lamp module 104, a chamber body assembly 106, a susceptor assembly 124, a lower window 120, and an upper window 122. The susceptor assembly 124 is disposed between the chamber body assembly 106 and the lower lamp module 104. The lower window 120 is disposed between the susceptor assembly 124 and the lower lamp module 104. The upper window 122 is disposed between the susceptor assembly 124 and the upper lamp module 102.

The upper lamp module 102 is disposed over the susceptor assembly 124 and configured to heat a substrate, such as the substrate 150, disposed on the susceptor assembly 124. The upper lamp module 102 includes an upper module body 126 and a plurality of lamp apertures 128 disposed through the upper module body 126. Each of the plurality of lamp apertures 128 includes an upper lamp 130 disposed therein. Each of the upper lamps 130 are coupled to a lamp base 129. Each of the lamp bases 129 supports one of the upper lamps 130 and electrically couples each of the upper lamps 130 to a power source. Each of the lamps 129 are secured in a generally vertical orientation within the apertures 128. As described herein, the generally vertical orientation of the upper lamps 130 is approximately perpendicular to the substrate support surface of the susceptor assembly 124. The vertical orientation of the upper lamps 130 is not necessarily perpendicular to the substrate support surface, and may be at an angle of about 30 degrees to about 150 degrees with respect to a substrate support surface 153 of the susceptor assembly 124. The angle can be about 45 degrees to about 135 degrees with respect to the substrate support surface 153, such as an angle of about 70 degrees to about 110 degrees with respect to the substrate support surface 153.

The upper lamp module 102 includes a heated gas passage 136 and a pyrometer passage 138. A heated gas supply source 132 is fluidly coupled to the heated gas passage 136. The heated gas passage 136 extends from the top surface to the bottom surface of the upper module body 126. The heated gas passage 136 is configured to allow heated gas, such as heated air or a heated inert gas, to flow from the heated gas supply source 132 to the top surface of the upper window 122 to convectively heat the upper window 122. The heated gas is supplied to an upper plenum 180 defined between the upper lamp module 102 and the upper window 122. A heated gas exhaust passage 142 is also disposed through the upper module body 126. The heated gas exhaust passage 142 is coupled to a heated exhaust pump 140. The heated exhaust pump 140 removes gas from the upper plenum 180. The heated exhaust pump 140 may also function as an exhaust pump for the process volume. The heated gas exhaust passage 142, in some embodiments, may be a groove formed along an edge of the upper module body 126 or may be formed through a separate component in fluid communication with the upper plenum 180.

The pyrometer passage 138 is disposed through the upper module body 126 to enable a pyrometer 134, such as a scanning pyrometer, to measure a temperature of the substrate 150, such as during conducting a substrate processing operation. The pyrometer 134 is disposed on top of the upper module body 126 adjacent to the pyrometer passage 138. The pyrometer passage 138 extends from the top surface of the upper module body 126 to the bottom surface adjacent to the upper window 122.

The lower lamp module 104 is disposed below the susceptor assembly 124 and configured to heat a bottom side of the substrate 150 disposed on the susceptor assembly 124. The lower lamp module 104 includes a lower module body 182 and a plurality of lamp apertures 186 disposed through the lower module body 182. Each of the plurality of lamp apertures 186 includes a lower lamp 188 disposed therein. Each of the lower lamps 188 are disposed in a generally vertical orientation and coupled to a lamp base 184. Each of the lamp bases 184 supports one of the lower lamps 188 and electrically coupled each of the lower lamps 188 to a power source. As described herein, the generally vertical orientation of the lower lamps 188 is described with respect to the substrate support surface 153 of the susceptor assembly 124. The generally vertical orientation is not necessarily perpendicular to the substrate support surface 906, and may be at an angle of about 30 degrees to about 150 degrees with respect to the substrate support surface 153. The angle can be about 45 degrees to about 135 degrees with respect to the substrate support surface 153, such as about 70 degrees to about 110 degrees with respect to the substrate support surface 153.

During the substrate processing operation, the upper lamps 130 are powered to generate heat downwardly along a Z-axis toward the substrate 150 and the susceptor 157. During the substrate processing operation, the lower lamps 188 are powered to generate heat upwardly along the Z-axis toward the substrate 150 and the susceptor 157.

The lower lamp module 104 includes a susceptor shaft passage 195 and a pyrometer passage 192. A support shaft 155 of the susceptor assembly 124 is disposed through the susceptor shaft passage 195. The susceptor shaft passage 195 is disposed through the middle of the lower module body 182. The susceptor shaft passage 195 is configured to allow the support shaft 155 of the susceptor assembly 124 and a portion of the lower window 120 to pass through the lower module body 182.

The pyrometer passage 192 is disposed through the lower module body 182 to enable a lower pyrometer 190, such as a scanning pyrometer, to measure the temperature of the bottom surface of the substrate 150 or a bottom surface of a susceptor 157 of the susceptor assembly 124. The lower pyrometer 190 is disposed below the lower module body 182 adjacent to the pyrometer passage 192. The pyrometer passage 192 is disposed from the bottom surface of the lower module body 182 to the top surface of the lower module body 182 adjacent to the lower window 120.

The chamber body assembly 106 includes an inject ring 116 and a base ring 114. The inject ring 116 is disposed on top of the base ring 114. The inject ring 116 includes one or more gas injectors 108 disposed therethrough. The base ring 114 includes a substrate transfer passage 162, one or more upper chamber exhaust passages 159 (shown in ghost in FIG. 1A), and a lower chamber exhaust passage 164 disposed therethrough. The substrate transfer passage 162 is disposed opposite the one or more upper chamber exhaust passages 159 and the lower chamber exhaust passage 164. The one or more upper chamber exhaust passages 159 can each include a portion disposed between the inject ring 116 and the base ring 114.

An upper chamber 111 is the portion of a process volume 110 in which the substrate 150 is processed and one or more process gases are injected. The lower chamber 113 is the portion of the process volume 110 in which the substrate 150 is loaded onto the susceptor assembly 124. The upper chamber 111 may also be understood as the volume above the susceptor 157 while the susceptor assembly 124 is in a processing position. The susceptor assembly 124 is shown in a lower position (e.g., a loading position for the substrate 150) in FIG. 1A, and the processing position is an upper position where the susceptor 157 is raised above the lower position. The lower chamber 113 is understood to be the volume below the susceptor 157 of the susceptor assembly 124 while the susceptor assembly 124 is in the processing position. The processing position is the position wherein the substrate 150 is disposed even with or above the horizontal plane 125. The horizontal plane 125 is the plane through which the inject ring 116 and the base ring 114 contact one another.

The one or more upper chamber exhaust passages 159 and the lower chamber exhaust passage 164 are coupled to one or more exhaust pumps. The one or more exhaust pumps are configured to remove exhaust gases from the process volume 110 via the one or more upper chamber exhaust passages 159 and the lower chamber exhaust passage 164. In one embodiment, which can be combined with other embodiments, each of the upper chamber exhaust passages 159 and the lower chamber exhaust passage 164 are coupled to a single exhaust pump using a plurality of conduits. In one embodiment, which can be combined with other embodiments, the upper chamber exhaust passages 159 are coupled to a different exhaust pump than the lower chamber exhaust passage 164.

The substrate transfer passage 162 is formed through the base ring 114 and is configured to allow the substrate 150 to pass therethrough from a transfer chamber of a cluster tool to be loaded on the susceptor 157. A flange 168 is attached to one end of the base ring 114 to enable the attachment of the process chamber 100 to a cluster tool. The substrate transfer passage 162 passes through the flange 168.

An upper cooling ring 118 and a lower cooling ring 112 are disposed on opposite sides of the chamber body assembly 106. The upper cooling ring 118 is disposed on top of the inject ring 116 and is configured to cool the inject ring 116. The lower cooling ring 112 is disposed below the base ring 114 and is configured to cool the base ring 114. The upper cooling ring 118 includes a coolant passage 146 disposed therethrough. The coolant which is circulated through the coolant passage 146 may include water or oil. The lower cooling ring 112 includes a coolant passage 148 disposed therethrough. The coolant which is circulated through the coolant passage 148 is similar to the coolant circulated through the coolant passage 146 of the upper cooling ring 118. The upper cooling ring 118 and the lower cooling ring 112 can assist in securing the inject ring 116 and the base ring 114 in place. The upper cooling ring 118 may partially support the upper lamp module 102 while the lower cooling ring 112 may partially support the base ring 114 and the inject ring 116.

A clamp ring can be used to secure the inject ring 116 and the base ring 114 in place. The present disclosure contemplates that the inject ring 116 can be integrated with the base ring 114 such that the inject ring 116 and the base ring 114 form a single body that is monolithic.

The use of the upper cooling ring 118 and the lower cooling ring 112 can reduce the temperature of the inject ring 116 and the base ring 114 without the need for additional cooling channels being disposed through the inject ring 116 and the base ring 114. Using the upper cooling ring 118 and the lower cooling ring 112 reduces the cost of the production of the inject ring 116 and the base ring 114, which can be more frequently replaced than the upper cooling ring 118 and the lower cooling ring 112. The present disclosure contemplates that the inject ring 116 and the base ring 114 can include one or more additional cooling passages formed therein.

The one or more gas injectors 108 of the inject ring 116 are disposed through one or more openings within the inject ring 116. The present disclosure contemplates that a plurality of gas injectors 108 can be disposed through the inject ring 116. The one or more gas injectors 108 are configured to supply the one or more process gases to the process volume 110 via one or more gas outlets 178. A single one of the one or more gas injectors 108 is shown in FIG. 1A. The gas injector 108 is shown as being disposed so the one or more gas outlets 178 are pointed downward toward the susceptor assembly 124 and the substrate 150. The downward angle of the gas injector 108 may be an angle of greater than about 5 degrees from an X-Y plane, such as greater than about 10 degrees from the X-Y plane. Each of the one or more gas outlets 178 are fluidly coupled to one or more process gas supply sources, such as the first process gas supply source 174 and/or the second process gas supply source 176. In some embodiments, only a first process gas supply source 174 is utilized. In an embodiment in which both the first process gas supply source 174 and the second process gas supply source 176 are utilized, there can be two gas outlets 178 within each gas injector 108. The two gas outlets 178 are disposed in a stacked fashion and enable mixing of the gases only after the gases enter the process volume 110. In one embodiment, which can be combined with other embodiments, the first process gas supply source 174 is a process gas while the second process gas supply source 176 is a cleaning gas. The cleaning gas can be used to clean features of the reflectometer system 200 in the process volume 110 and/or features of the reflectometer system 400 in the process volume 110, as discussed below in relation to optional operation 510 of the method 500. In one embodiment, which can be combined with other embodiments, both the first process gas supply source 174 and the second process gas supply source 176 are process gases.

The upper window 122 is disposed between the inject ring 116 and the upper lamp module 102. The upper window 122 is an optically transparent window, such that radiant energy produced by the upper lamp module 102 may pass therethrough. The upper window 122 is formed of a quartz or a glass material. The upper window 122 is a dome shape and can be described as an upper dome. The upper window 122 can be conical in shape. The outer edges of the upper window 122 form one or more peripheral supports 172. The peripheral supports 172 are thicker than the central portion of the upper window 122. The peripheral supports 172 are disposed on top of the inject ring 116. The one or more peripheral supports 172 connect to the central portion of the upper window 122. The peripheral supports 172 are optically opaque, and can be formed of an opaque quartz. The peripheral supports 172 can be ring-shaped.

The lower window 120 is disposed between the base ring 114 and the lower lamp module 104. The lower window 120 is an optically transparent window, such that radiant energy produced by the lower lamp module 104 may pass therethrough. The lower window 120 is formed of a quartz or a glass material. The lower window 120 can be a dome shape and can be described as a lower dome. The lower window 120 can be conical in shape. Outer edges of the lower window 120 form one or more peripheral supports 170. The one or more peripheral supports 170 are thicker than a central portion of the lower window 120. The one or more peripheral supports 170 connect to the central portion of the lower window 120 and are formed of an optically opaque material, such as opaque quartz. The one or more peripheral supports 170 can be ring-shaped.

A variety of liners and heaters are disposed inside of the chamber body assembly 106 and within the process volume 110. As shown in FIG. 1A, there is an upper liner 156 and a lower liner 154 disposed within the chamber body assembly 106. The upper liner 156 is disposed above the lower liner 154 and inward of the inject ring 116. The lower liner 154 is disposed inward of the base ring 114. The upper liner 156 and the lower liner 154 are configured to be coupled together and/or the upper liner 156 is supported on the lower line 154 while in the process volume 110. The upper liner 156 and the lower liner 154 are configured to shield the inner surfaces of the inject ring 116 and the base ring 114 from the process gases within the process volume 110. The upper liner 156 and the lower liner 154 further serve to reduce heat loss from the process volume 110 to the inject ring 116 and the base ring 114. Reduced heat loss improves heating uniformity of the substrate 150 and enables more uniform deposition on the substrate 150 during conducting of the substrate processing operation (e.g., the epitaxial deposition operation).

An upper heater 158 and a lower heater 152 are also disposed within the chamber body assembly 106 and the process volume 110. As shown in FIG. 1A, the upper heater 158 is disposed between the upper liner 156 and the inject ring 116 while the lower heater 152 is disposed between the lower liner 154 and the base ring 114. Both of the upper heater 158 and the lower heater 152 are disposed inward of the chamber body assembly 106 to enable more uniform heating of the substrate 150 while the substrate 150 is within the process chamber 100. The upper heater 158 and the lower heater 152 reduce heat loss to the walls of the chamber body assembly 106 and create a more uniform temperature distribution around the surfaces forming the process volume 110. Each of the upper liner 156, the lower liner 154, the upper heater 158, and the lower heater 152 can be coupled to a flange disposed within the process volume 110. The flange can be a horizontal surface configured to be secured between a portion of the inject ring 116 and the base ring 114 to enable securing of each of the upper liner 156, the lower liner 154, the upper heater 158, and the lower heater 152. Both the upper heater 158 and the lower heater 152 may be configured to have a heated fluid run therethrough or may be resistive heaters. The upper heater 158 and the lower heater 152 are further shaped to accommodate openings through the inject ring 116 and the base ring 114. The lower liner 154 includes a transfer opening 131 aligned with the transfer passage 162 and an exhaust opening 133 aligned with the lower exhaust passage 164. The lower heater 152 (if used) includes a transfer opening aligned with the transfer passage 162 and an exhaust opening aligned with the lower exhaust passage 164.

The susceptor assembly 124 is disposed within the process volume 110 and is configured to support the substrate 150 during processing. The susceptor assembly 124 includes the planar substrate support surface 153 for supporting the substrate 150 and the shaft 155 which extends through a portion of the lower window 120 and the lower lamp module 104. The susceptor assembly 124 is coupled to a movement assembly 194. The movement assembly 194 includes a rotation assembly 196 and a lift assembly 198. The rotation assembly 196 is configured to rotate of the susceptor assembly 124 about a central axis A, while the lift assembly 198 is configured to move the susceptor assembly 124 linearly within the process volume 110 along the central axis A. The rotation assembly 196 is configured to rotate the susceptor assembly 124 and the substrate 150 during the conducting of the substrate processing operation.

Figure 1B:
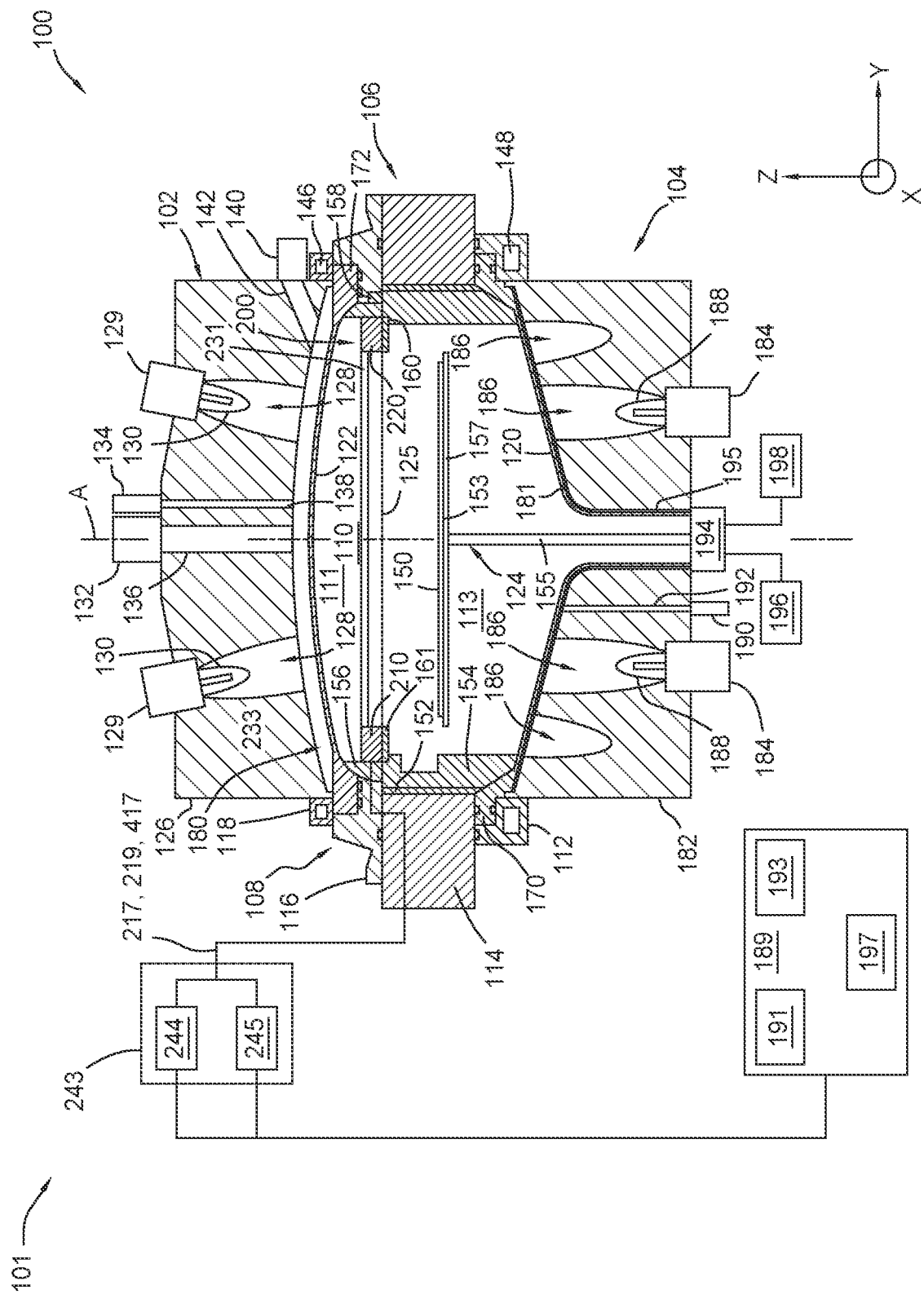
FIG. 1B is a schematic cross-sectional view of the system shown in FIG. 1A, along a section perpendicular to the section shown in FIG. 1A, according to one implementation.

FIG. 1B is a schematic cross-sectional view of the system 101 shown in FIG. 1A, along a section perpendicular to the section shown in FIG. 1A, according to one implementation.

The system 101 includes a reflectometer system 200 disposed at least partially in the process volume 110. The reflectometer system 200 includes a first block 210 and a second block 220 that opposes the first block 210 in the X-Y plane that is perpendicular to the Z-axis. The first block 210 and the second block 220 are disposed in the process volume 110. The first block 210 and the second block 220 are supported on a pre-heat ring 161. The pre-heat ring 161 is supported on a ledge 160 of the lower liner 154. The lower liner 154 and the base ring 114 are at least a part of one or more sidewalls of the chamber body assembly 106.

Figure 2:
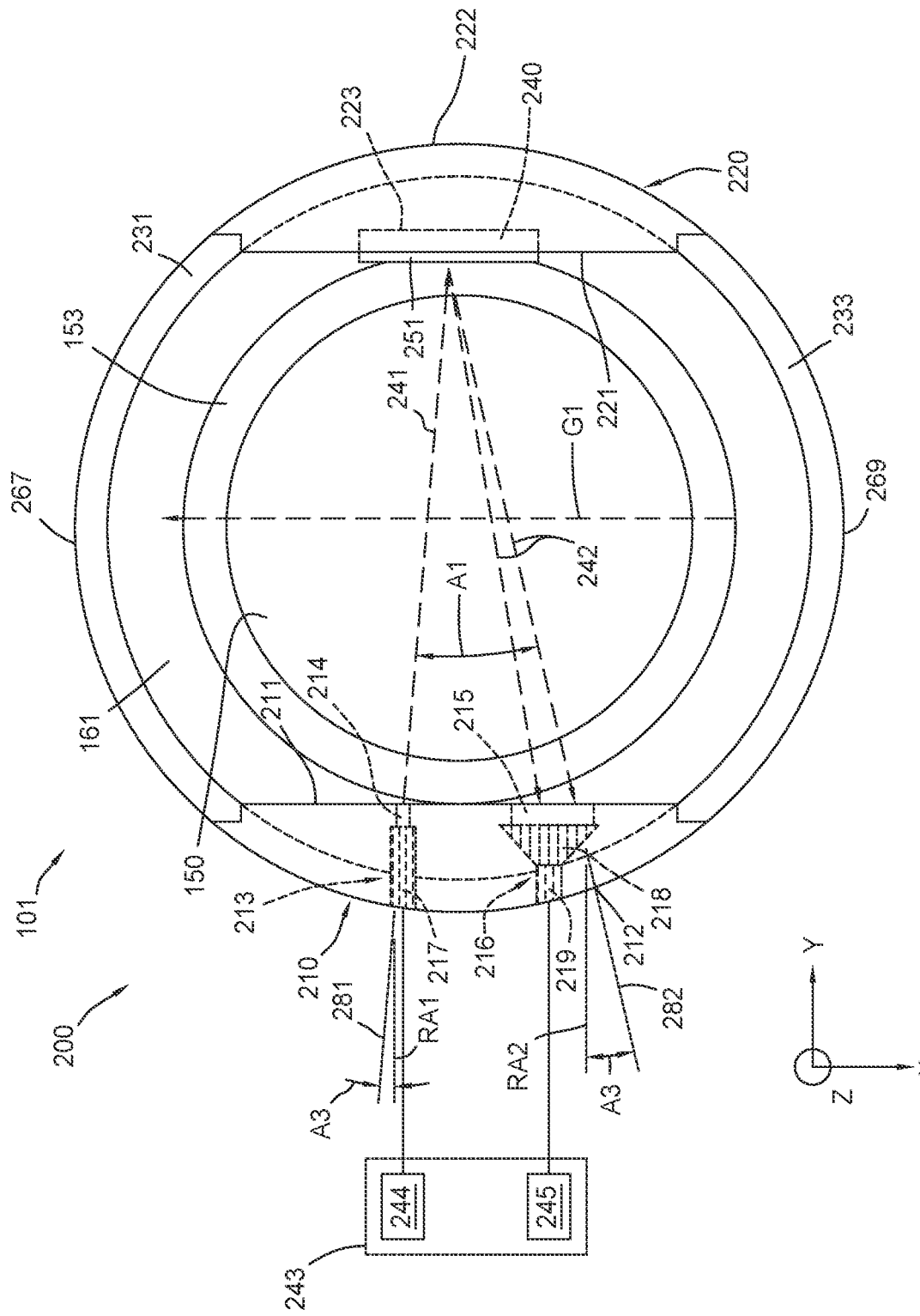
FIG. 2 is a partial schematic top view of the system shown in FIGS. 1A and 1B, according to one implementation.

FIG. 2 is a partial schematic top view of the system 101 shown in FIGS. 1A and 1B, according to one implementation. The first block 210 includes a first inner surface 211 that is planar and a first curved outer surface 212. The first curved outer surface 212 interfaces with (e.g., contacts) the upper liner 156 shown in FIG. 1B. A first window 214 and a second window 215 are formed in the first inner surface 211. The second window 215 is wider than the first window 214. Each of the first window 214 and the second window 215 is a transparent quartz window. In one embodiment, which can be combined with other embodiments, the first window 214 and the second window 215 allow light having a predetermined wavelength (such as the wavelength described below for the light 241) to pass therethrough while blocking light having other wavelengths from passing therethrough. A light emitter 213 is disposed in the first block 210 and oriented toward the first inner surface 211. The light emitter 213 is at least partially disposed within the first block 210 and at least partially disposed between the first window 214 and the first curved outer surface 212. A light receiver 216 is disposed in the first block 210 and oriented toward the first inner surface 211. The light receiver 216 is at least partially disposed within the first block 210 and at least partially disposed between the second window 215 and the first curved outer surface 212. The second block 220 opposes the first block 210 in the X-Y plane, as shown in FIG. 2. The second block 220 includes a second inner surface 221 that is planar facing the first inner surface 211, a second curved outer surface 222, and a coupon opening 223 formed in the second inner surface 221. The second inner surface 221 is parallel to the first inner surface 211. The reflectometer system 200 includes a first connector bar 231 and a second connector bar 233 separating the first block 210 and the second block 220. The first connector bar 231 and the second connector bar 233 are each formed of quartz (such as transparent quartz or opaque quartz) or graphite that is coated with silicon carbide (SiC). The first and second connectors bars 231, 233 facilitate retaining the first and second blocks 210, 220 against a sidewall of the process chamber 100 (e.g., against the upper liner 156). Using the first and second connector bars 231, 233 and the pre-heat ring 161, rotation of the first and second blocks 210, 220 is reduced or eliminated when the susceptor 157 and the substrate 150 are rotated using the rotation assembly 196, thereby facilitating reduced noise from rotation and accurate film growth monitoring.

A crystalline coupon 240 is disposed on or at least partially in the second block 220. The crystalline coupon 240 is formed of silicon carbide (SiC). The crystalline coupon 240 disposed in and retained in the coupon opening 223 formed in the second inner surface 221. During the substrate processing operation, the light emitter 213 directs light 241 through the first window 214 and toward a front side of the crystalline coupon 240. The light 241 is emitted through one or more fiber optic cables 217 of the light emitter 213. The light 241 reflects off of the crystalline coupon 240 as reflected light 242. In one embodiment, which can be combined with other embodiments, a frontside surface (on which film 251 is deposited) of the crystalline coupon 240 is polished. The reflected light 242 is collected by the light receiver 216 through the second window 215. The reflected light 242 is collected through a transparent light collector 218 disposed in the first block 210 and one or more fiber optic cables 219 coupled to the transparent light collector 218. The transparent light collector 218 includes a prism and/or a lens. In the implementation shown in FIG. 2, the transparent light collector 218 includes a prism. The transparent light collector 218 refracts the reflected light 242 as the reflected light 242 passes through the transparent light collector 218 and to the one or more fiber optic cables 219. The one or more fiber optic cables 217 of the light emitter 213 are coupled to a light source 244. The one or more fiber optic cables 219 of the light receiver 216 coupled the transparent light collector 218 to a sensor 245. The light source 244 and the sensor 245 can be a part of the same optical module 243. The one or more fiber optic cables 219 transmit the reflected light 242 to the sensor 245. The transparent light collector 218 includes a viewing angle A2 that is greater than 45 degrees, such as within a range of 70 degrees to 170 degrees. The viewing angle A2 facilitates increased collection of reflected light 242 and monitoring accuracy.

The present disclosure contemplates that the first window 214 can be omitted, and both the one or more fiber optic cables 217 and the one or more fiber optic cables 219 can be aligned with the second window 215 along two respective axes parallel to the Y-axis. In such an embodiment, the transparent light collector 218 can be omitted.

The sensor 245 is configured to measure a light intensity of the reflected light 242. In one embodiment, which can be combined with other embodiments, the sensor 245 includes an optical spectrometer (such as a spectrograph) configured to measure wavelength-resolved intensity. The sensor 245 can include grating, an optical lens, and/or a linear-array photodiode detector. The light source 244 is configured to generate the light 241 at a wavelength that is within a range of 300 nanometers (nm) to 700 nanometers, such as within a range of 300 nm to 600 nm. In one embodiment, which can be combined with other embodiments, the light 244 has a wavelength within a range of 580 nm to 620 nm. In one embodiment, which can be combined with other embodiments, the light 241 is infrared (IR) light. In one embodiment, which can be combined with other embodiments, the light 241 is visible light. In one embodiment, which can be combined with other embodiments, the light 241 is broadband light.

Each of the first block 210 and the second block 220 is formed of graphite. The graphite of each of the first block 210 and the second block 220 is coated with silicon carbide (SiC). The crystalline coupon 240 has a crystalline structure. The crystalline structure can be 3C, 4H, or 6H. Other crystalline structures are contemplated. In the implementation shown in FIG. 2, the crystalline structure is 3C.

In the implementation shown in FIG. 2, the light receiver 216 collects the reflected light that is reflected at an oblique angle A1 relative to the light 241. During the substrate processing operation, one or more process gases G1 are injected through the process volume 110 from an inject side to an exhaust side of the process chamber 100 while the upper lamps 130 and the lower lamps 188 heat the substrate 150. The one or more process gases G1 and the heat facilitate epitaxially depositing film on the substrate 150. The one or more process gases G1 and the heat also facilitate epitaxially depositing film on the crystalline coupon 240. While the one or more process gases G1 flow and the lamps 130, 188 heat the substrate 150, the light 241 is emitted and the reflected light 241 is collected to determine a light intensity of the reflected light 241. The measured light intensity of the reflected light 241 is used to determine a film thickness and/or a growth rate of film 251 deposited on the crystalline coupon 240. The film 251 deposited on the crystalline coupon 240 and the film deposited on the substrate 150 each includes silicon (Si) and/or silicon-germanium (SiGe). The present disclosure contemplates that other film materials may be used, such silicon phosphide (SiP), silicon arsenide (SiAs), boron doped silicon-germanium (SiGeB), and/or one or more other Group III, Group IV, and/or Group V elements. The thickness of the deposited film 251 on the crystalline coupon 240 affects the light intensity of the reflected light 241, such that a change in the light intensity can signal a change in the thickness of the deposited film 251 on the crystalline coupon 240. In one embodiment, which can be combined with other embodiments, a lower light intensity indicates a higher film thickness on the crystalline coupon 240, and a higher light intensity indicates a lower film thickness on the crystalline coupon 240. In one embodiment, which can be combined with other embodiments, the light intensity of the reflected light 241 is monitored continuously throughout the substrate processing operations. The present disclosure contemplates that light intensity changes may not be linear and can occur in a sinusoidal fashion. The beam path for the light 241 and the reflected light 242 is reduced compared to configurations where light is directed vertically upwardly or downwardly toward the substrate 150, facilitating accurate film growth monitoring.

Each of the one or more fiber optic cables 217, the first window 214, the one or more fiber optic cables 219, the transparent light collector 218, and/or the second window 215 can be oriented parallel to the Y-axis (as is shown in FIG. 2) such that centerline axes thereof are parallel to the Y-axis. Each of the one or more fiber optic cables 217 and/or the first window 214 can be oriented at an oblique angle A3 relative to a first reference axis RA1 that is parallel to the Y-axis such that centerline axes thereof are disposed at the oblique angle A3 relative to the first reference axis RA1.

Each of the the one or more fiber optic cables 219, the transparent light collector 218, and/or the second window 215 can be oriented at the oblique angle A3 relative to a second reference axis RA2 that is parallel to the Y-axis such that centerline axes thereof are disposed at the oblique angle A3 relative to the second reference axis RA2. The oblique angle A3 is approximately one-half of the oblique angle A1. In one example, which can be combined with other examples, centerline axes of the one or more fiber optic cables 217 and the first window 214 can be coaxial with a first axis 281 disposed at the oblique angle A3 relative to the first reference axis RA1. In one example, which can be combined with other examples, centerline axes of the one or more fiber optic cables 219, the transparent light collector 218, and/or the second window 215 can be coaxial with a second axis 282 disposed at the oblique angle A3 relative to the second reference axis RA2. The reflectometer system 200 can be used to monitor film growth rate in-situ in the processing volume 110 and in real-time while the substrate processing operation is conducted on the substrate 150 supported on the susceptor 157. Interference from light irradiated from the lamps 130, 188 is reduced as the light 241 is emitted in the X-Y plane and the reflected light 242 is reflected and collected in the X-Y plane. The likelihood is reduced that light from the lamps 130, 118 will be collected and transmitted to the sensor 245 and/or will wash out the light 241 and the reflected light 242. The light irradiated from the lamps 130, 188 includes at least one vector that is parallel to the Z-axis, which is perpendicular to the light 241 and the reflected light 242 to reduce interference of the irradiated light with the light 241 and the reflected light 242, thereby facilitating in-situ and accurate growth rate monitoring in a real-time fashion during the substrate processing operation. The reduced interference facilitates an increased signal:noise ratio for the sensor 245 of the reflectometer system 200 for accurate film growth measurements. The reduced interference also facilitates using shorter wavelengths for the light 241 to increase resolution for the sensor 245 of the reflectometer system 200 for accurate film growth measurements. The crystalline coupon 240 is used to simulate epitaxial deposition of film on the substrate 150 without directly monitoring film growth on the substrate 150, reducing the need to direct the light 241 either downwardly toward the substrate 150 or upwardly toward the substrate 150.

The configuration of the reflectometer system 200, such as the blocks 210, 220 and the connector bars 231, 233, facilitates heating the crystalline coupon 240 to a temperature that is similar to a temperature to which the substrate 150 is heated, facilitating accurate simulation of film growth on the substrate 150. The crystalline coupon 240 is located in a position that is near the substrate 150, such as near the substrate 150 along the X-Y plane, facilitating accurate simulation while reducing disruption of film growth uniformity on the substrate 150.

Figure 3A:
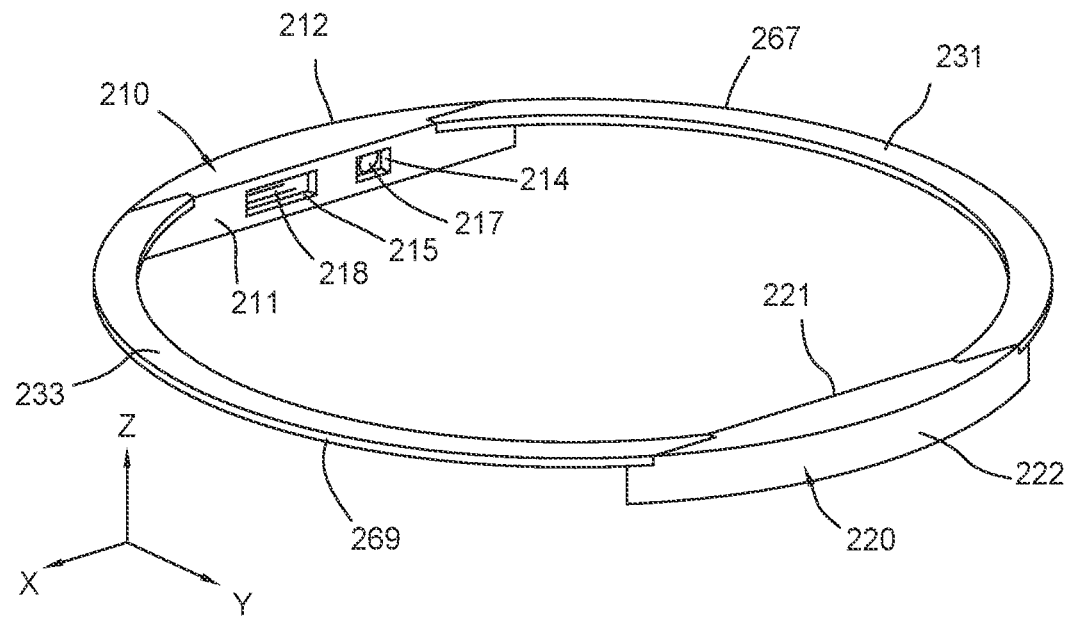
FIG. 3A is a front isometric view of the first block, the second block, the first bar connector, and the second bar connector shown in FIG. 2, according to one implementation.
Figure 3B:
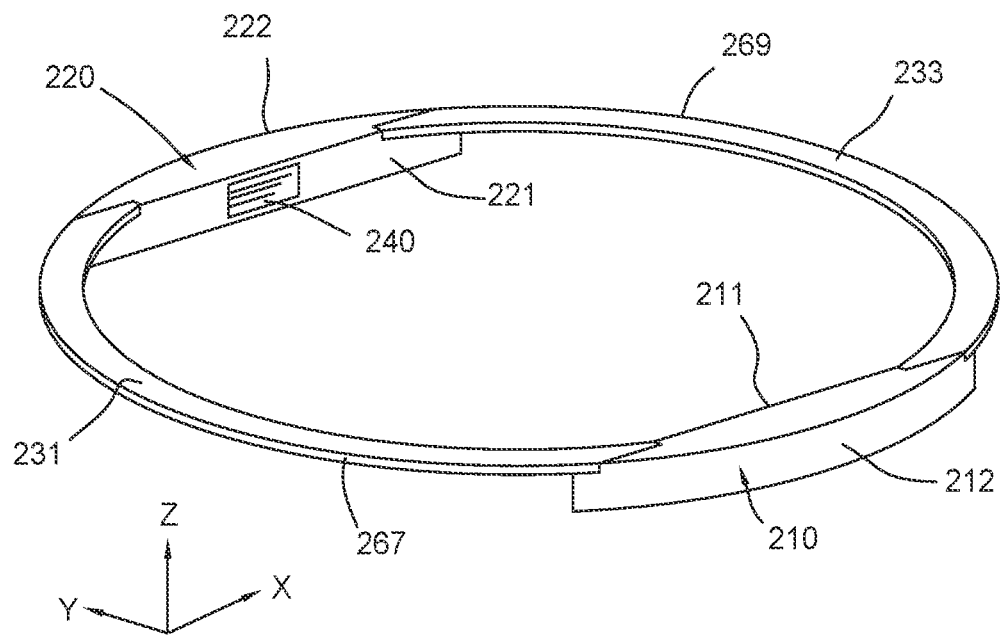
FIG. 3B is a rear isometric view of the first block, the second block, the first bar connector, and the second bar connector shown in FIG. 3A, according to one implementation.
Figure 3C:
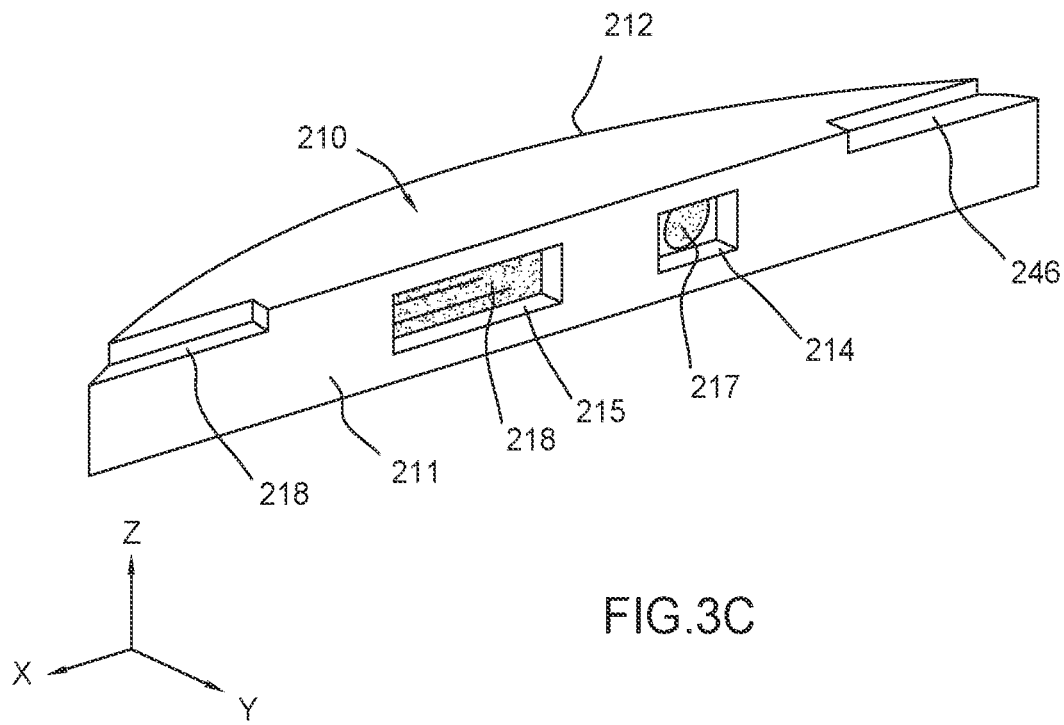
FIG. 3C is a front isometric view of the first block shown in FIG. 3A, according to one implementation.
Figure 3D:
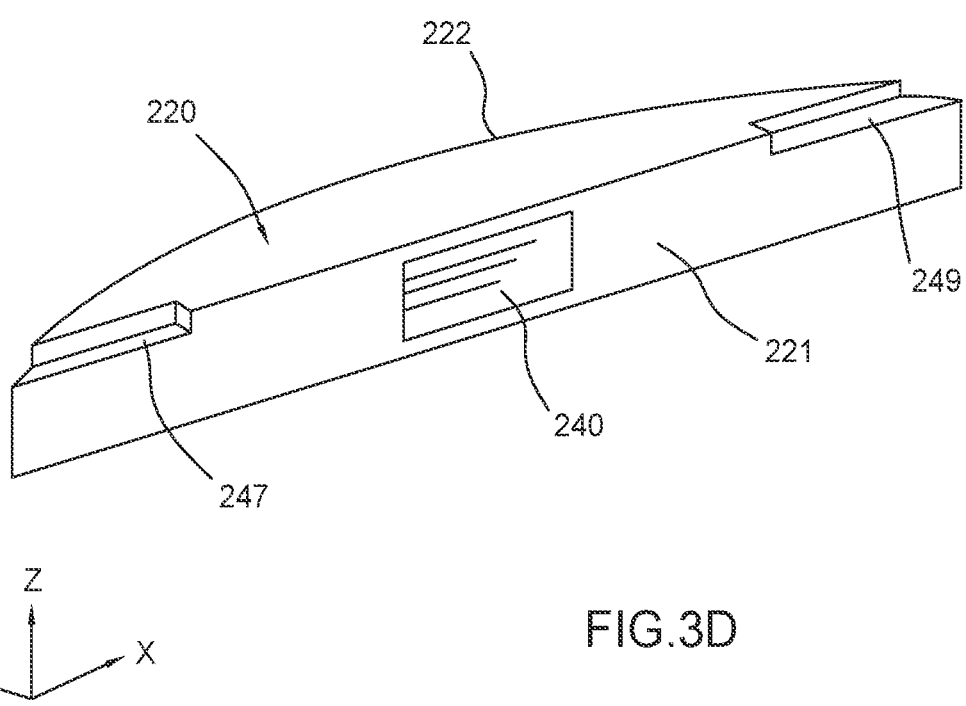
FIG. 3D is a front isometric view of the second block shown in FIG. 3B, according to one implementation.

FIG. 3A is a front isometric view of the first block 210, the second block 220, the first bar connector 231, and the second bar connector 233 shown in FIG. 2, according to one implementation. FIG. 3B is a rear isometric view of the first block 210, the second block 220, the first bar connector 231, and the second bar connector 233 shown in FIG. 3A, according to one implementation. FIG. 3C is a front isometric view of the first block 210 shown in FIG. 3A, according to one implementation. FIG. 3D is a front isometric view of the second block 220 shown in FIG. 3B, according to one implementation.

Each of the first connector bar 231 and the second connector bar 233 is a ring component that is a section of a ring. An outer edge 267 of the first connector bar 231, an outer edge 269 of the second connector bar 233, the first curved outer surface 212, and the second curved outer surface 222 together form a concentric circle in the X-Y plane.

The first connector bar 231 is received in a first recess 246 formed in the first inner surface 211 and a first recess 247 formed in the second inner surface 221. The second connector bar 233 is received in a second recess 248 formed in the first inner surface 211 and a second recess 249 formed in the second inner surface 221. One or more of the first block 210, the second block 220, the first connector bar 231, the second connector bar 233, and/or the pre-heat ring 161 can be integrated into a single body that is monolithic.

Figure 4:
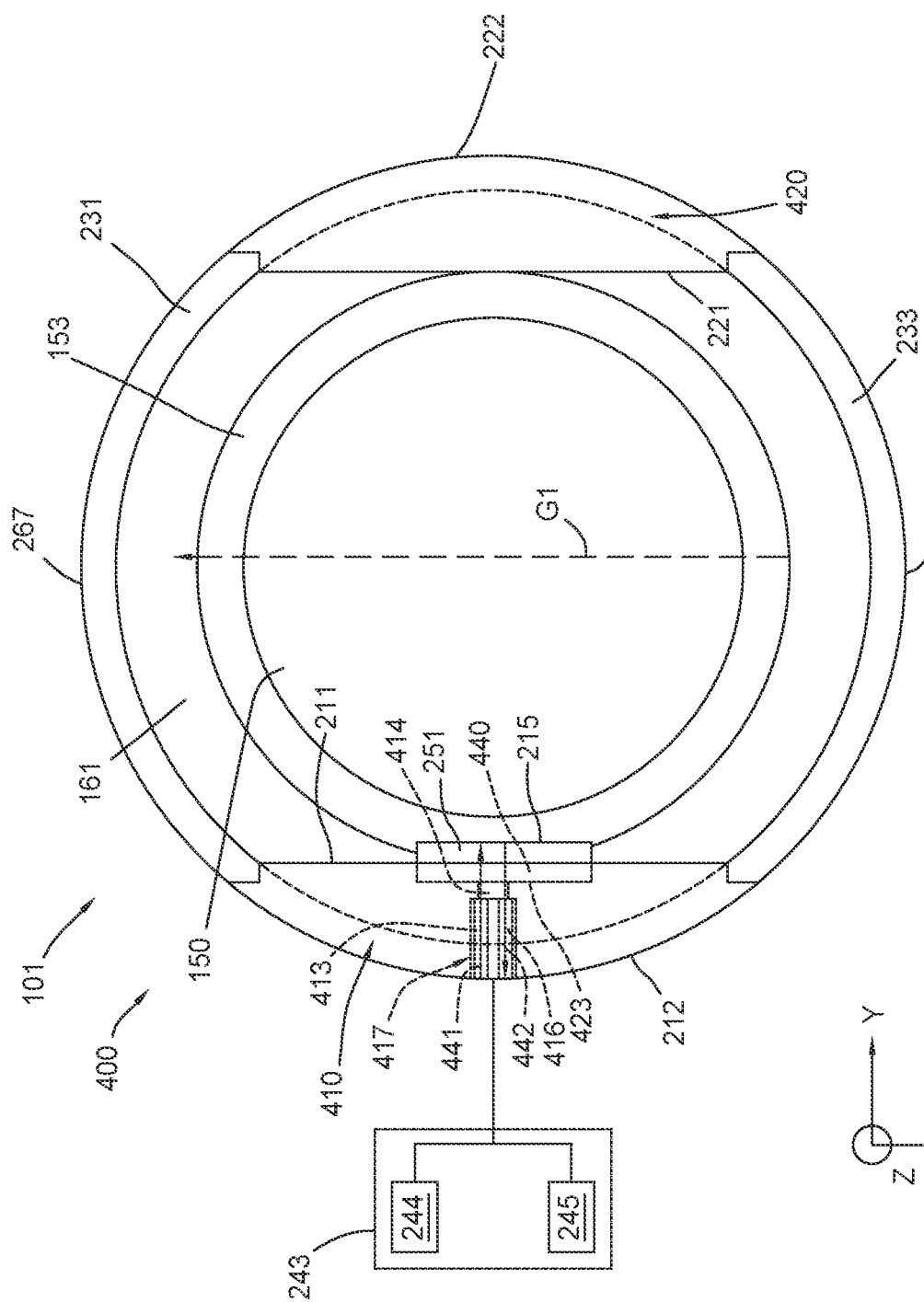
FIG. 4 is a partial schematic top view of the system shown in FIGS. 1A and 1B, according to one implementation.

FIG. 4 is a partial schematic top view of the system 101 shown in FIGS. 1A and 1B, according to one implementation. The system 101 includes a reflectometer system 400 that is similar to the reflectometer system 200 shown in FIGS. 1A, 1B, and 2, and can include one or more of the features, aspects, components, and/or properties thereof. The reflectometer includes a first block 410 and a second block 420 that opposes the first block 410 in the X-Y plane. The second block 420 is similar to the second block 220, and does not include the coupon opening 223.

The first block 410 is similar to the first block 210, and the first block 410 includes a coupon opening 423 formed in the first inner surface 211.

A crystalline coupon 440 is disposed on or at least partially in the first block 410. The crystalline coupon 440 is disposed in and retained in the coupon opening 423. The reflectometer system 400 includes one or more fiber optic cables 417 (one is shown in FIG. 4) disposed at least partially in the first block 410. A window 414 is formed in the first block 410 between the one or more fiber optic cables 417 and the coupon opening 423. The one or more fiber optic cables 417 each include a light emitter that has one or more ingoing optical fibers 413 and a light receiver that has one or more outgoing optical fibers 416. The one or more ingoing optical fibers 413 are coupled to the light source 244. The one or more ingoing optical fibers 413 direct light 441 through the window 414 and through the crystalline coupon 440. The light 441 reflects off of film 251 deposited on the crystalline coupon 440 as reflected light 442. In the implementation shown in FIG. 4, the light 441 and the reflected light 442 are parallel to each other in the X-Y plane. The one or more outgoing optical fibers 416 collect the reflected light 442 and transmit the reflected light 442 to the sensor 245 such that a light intensity of the reflected light 442 can be measured and a growth rate for the film 251 can be determined and monitored.

The crystalline coupon 440 is formed of silicon carbide (SiC) and has a crystalline structure. The crystalline structure can be 3C, 4H, or 6H. Other crystalline structures are contemplated. In the implementation shown in FIG. 4, the crystalline structure is 6H to facilitate allowing the light 441 to pass through the crystalline coupon 440 to reach the film 251.

As shown in FIG. 1B, the respective one or more fiber optic cables 217, one or more fiber optic cables 219, and/or one or more fiber optic cables 417 are disposed partially in the first block 210, 410, and extend through the processing chamber 100 to the optical module 243 to couple respectively to the light source 244 and/or the sensor 245. The respective one or more fiber optic cables 217, one or more fiber optic cables 219, and/or one or more fiber optic cables 417 extend through the base ring 114, the inject ring 116, and/or the upper liner 156, as shown in FIG. 1B. The present disclosure contemplates that the respective one or more fiber optic cables 217, one or more fiber optic cables 219, and/or one or more fiber optic cables 417 can extend through an exhaust cap, such as the upper module body 126 and/or the upper window 122. The optical module 243 having the light source 244 and the sensor 245 is disposed outside of the process volume 110 and on the exterior of the processing chamber 100. In one embodiment, which can be combined with other embodiments, the optical module 243 is mounted to an exterior surface of the process chamber 100. The optical module 243 being disposed outside of the process volume 110 facilitates ease of maintenance, and reducing or eliminating effects of heat and process gases on the light source 244 and the sensor 245, thereby facilitating accurate film growth monitoring.

Referring to FIGS. 1A and 1B, the system 101 includes a controller 189 coupled to the process chamber 100 to control operations of the process chamber and the reflectometer system 200, 400. The controller 189 includes a central processing unit (CPU) 191, a memory 193 containing instructions, and support circuits 197 for the CPU 191. The controller 189 controls the system 101 directly, or via other computers and/or controllers coupled to the process chamber 100. The controller 189 is of any form of a general-purpose computer processor that is used in an industrial setting for controlling various chambers and equipment, and sub-processors thereon or therein.

The memory 193, or non-transitory computer readable medium, is one or more of a readily available memory such as random access memory (RAM), read only memory (ROM), floppy disk, hard disk, flash drive, or any other form of digital storage, local or remote. The support circuits 197 are coupled to the CPU 191 for supporting the CPU 191 (a processor). The support circuits 197 include cache, power supplies, clock circuits, input/output circuitry and subsystems, and the like. Substrate processing parameters and operations are stored in the memory 193 as a software routine that is executed or invoked to turn the controller 189 into a specific purpose controller to control the operations of the system 101. The controller 120 is configured to conduct any of the methods described herein. The instructions stored on the memory 193, when executed, cause one or more of operations 502-512 of method 500 to be conducted.

The controller 189 is coupled to the light source 244 and the sensor 245 of the optical module 243. The controller 189 is configured to instruct the light source 244 to supply the light 241, receive measure light intensity values from the sensor 245, and determine film thicknesses and/or film growth rates of the film 251 on the crystalline coupon 240, 440 using the light intensity values. The plurality of instructions executed by the controller 189 include instructions cause such operations to be conducted. The instructions in the memory 193 of the controller 189 can include one or more machine learning/artificial intelligence algorithms that can be executed in addition to the operations described herein. The determined film thicknesses and/or film growth rates of the film 251 can be stored in the memory 193 for use in subsequent film growth monitoring operations.

As an example, a machine learning/artificial intelligence algorithm executed by the controller 189 can optimize and alter operational parameters of the system 101 based on the film thickness and/or film growth rate determinations. The one or more operational parameters can include: a flow rate and/or a temperature of the process gas(es), a power supplied to the upper and/or lower lamps, a processing temperature of the substrate, an operational time in which the substrate processing operation is conducted, and/or a processing pressure in the process volume. The controller 189 can be coupled, for example, to the vacuum pump, the lower lamps 188, the rotation assembly 196, the lift assembly 198, the first process gas supply source 174, the second process gas supply source 176, the upper lamps 130, the heated gas supply source 132, and/or the heated exhaust pump 140. The controller 189 can be coupled, for example, to one or more mass flow controllers (MFCs) coupled between the first and second process gas supply sources 174, 176.

The sensor 245 and/or the controller 189 can be calibrated to a target parameter, such as a target film thickness or a target film growth rate, that is predetermined to result from the substrate processing operation.

Figure 5:
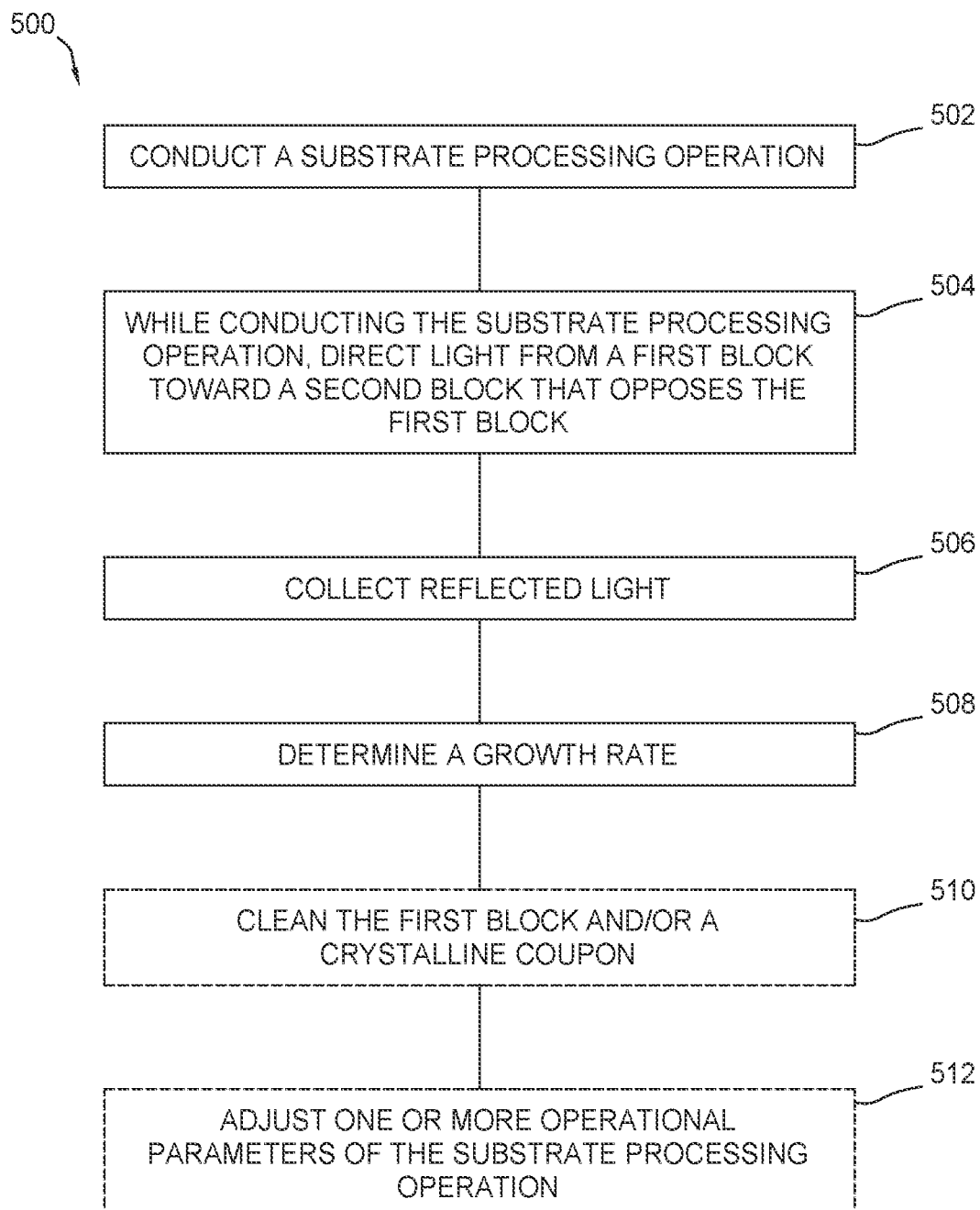
FIG. 5 is a schematic block diagram view of a method of monitoring film growth for substrate processing operations, according to one implementation.

FIG. 5 is a schematic block diagram view of a method 500 of monitoring film growth for substrate processing operations, according to one implementation. Operation 502 includes conducting a substrate processing operation on a substrate supported on a susceptor disposed in a process volume of a process chamber. The substrate processing operation includes flowing one or more process gases into the process volume, and heating the substrate. The heating the substrate includes generating heat along a Z-axis toward the substrate.

The substrate processing operation can be an epitaxial deposition operation. Operation 504 includes, while conducting the substrate processing operation, directing light from a light emitter disposed in a first block toward a crystalline coupon coupled to a second block that opposes the first block. The directing light includes directing light from the light emitter toward the crystalline coupon along an X-Y plane that is perpendicular to the Z-axis.

Operation 506 includes collecting reflected light that is reflected off of the crystalline coupon. The reflected light is collected through a transparent light collector disposed in the first block and transmitted to a sensor disposed outside of the process volume.

Operation 508 includes determining a growth rate of the crystalline coupon using the reflected light. The determining the growth rate includes measuring a plurality of light intensity values of the reflected light across one or more time intervals. The plurality of light intensity values are correlated to reference data or physical models based on Fresnel's equations of electromagnetic wave reflection to determine the growth rate across one or more time intervals. The growth rate can correspond to a change in light intensity across the one or more time intervals. A film thickness can be determined using the growth rate at a certain time interval. Optional operation 510 includes cleaning the first block and/or the crystalline coupon. A coupon opening of the first block, a coupon opening of the second block, one or more windows of the first block, first and second inner surfaces of the first and second blocks, and/or the crystalline coupon are cleaned at optional operation 510. The cleaning of the crystalline coupon can include cleaning a film deposited on the crystalline coupon. The crystalline coupon can be removed from the respective coupon opening to clean the respective coupon opening and/or the one or more windows of the first block.

Optional operation 512 includes adjusting one or more operational parameters of the substrate processing operation using the growth rate determined at operation 508. For example, if the growth rate is too high or too low, the one or more operational parameters can be adjusted to correct the growth rate to be equal to or closer to a target growth rate. The adjusting of optional operation 512 can occur during the substrate processing operation and/or during a subsequent iteration of the substrate processing operation conducted on a second substrate. The one or more operational parameters can include: a flow rate and/or a temperature of the process gas(es), a power supplied to the upper and/or lower lamps, a processing temperature of the substrate, an operational time in which the substrate processing operation is conducted, and/or a processing pressure in the process volume.

The present disclosure contemplates that the operations 502-512 of the method 500 can be repeated. In one embodiment, which can be combined with other embodiments, the operations 502-512 are repeated for a second substrate after the substrate is removed from the process volume of the process chamber and the second substrate is transferred into the process volume. The present disclosure contemplates that the same crystalline coupon can be used for processing of the second substrate, or the crystalline coupon can be replaced with a second crystalline coupon for processing of the second substrate.

FIG. 6 is a schematic plan view of an optical module 600, according to one implementation. The optical module 600 can be used as the optical module 243.

The optical module 600 includes a focusing lens 601 with a mounting adaptor, and a beam splitter 603. The beam splitter 603 allows the light 441 from a light source 605 to pass through to the focusing lens 601, and directs the reflected light 442 through a directional filter assembly 607 to a sensor 609. A black absorber 630 is coupled to the beam splitter 603. The black absorber 630 absorbs light 441 and/or reflected light 442 that reaches the black absorber 630 to facilitate or eliminate reduced multiple reflections of light. The black absorber 630 facilitates dissipating transmitted energy. The light source 605 can include a condenser. The light source 605 includes one or more light emitting diodes (LEDs). In one embodiment, which can be combined with other embodiments, the sensor 609 includes a silicon photodiode and an amplifier. The sensor 609 converts the analog reflected light signal to a digital signal 611 indicating measured light intensity, and transmits the digital signal 611 to the controller 189. The light source 605 is coupled to a driver 615, such as an LED driver. The driver 615 is coupled to a power source 617.

The directional filter assembly 607 facilitates reducing interference of heat light irradiated from lamps, and facilitates increased signal:noise ratio to facilitate accurate film growth monitoring. In one embodiment, which can be combined with other embodiments, the directional filter assembly 607 filters portions of the reflected light 442 that have perpendicular vectors when passing through the directional filter assembly 607 toward the sensor 609. The perpendicular vectors are perpendicular to a direction extending from the directional filter assembly 607 and toward the sensor 609.

Benefits of the present disclosure include in-situ and real-time film growth measurement operations, accurate film growth monitoring, increased signal:noise ratios, using reduced light wavelengths, increased measurement resolutions, increased efficiency and throughput, reduced machine downtime, and reduced costs.

It is contemplated that one or more aspects disclosed herein may be combined. As an example, one or more aspects, features, components, and/or properties of the system 100, the processing chamber 100, the reflectometer system 200, the reflectometer system 400, and/or the method 500 may be combined. Moreover, it is contemplated that one or more aspects disclosed herein may include some or all of the aforementioned benefits.

The present disclosure achieves unexpected results as it has been thought that measuring film growth in the process volume of the process chamber would involve inaccuracies resulting from the use of upper and lower domes and/or light irradiated from lamps for heating the substrate. The present disclosure achieves the aforementioned benefits over operations that conduct on-substrate film measurements after the substrate is processed and removed from the process chamber.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A reflectometer system to monitor film growth during substrate processing operations, comprising:
 a first block comprising a first inner surface;
 a light emitter disposed in the first block and oriented toward the first inner surface;
 a light receiver disposed in the first block and oriented toward the first inner surface;
 a second block opposing the first block, the second block comprising:
 a second inner surface facing the first inner surface; and
 a first connector bar coupled to the first block and the second block, and a second connector bar coupled to the first block and the second block, the first connector bar and the second connector bar separating the first block and the second block.

2. The reflectometer system of claim 1, wherein each of the first block and the second block is formed of graphite.

3. The reflectometer system of claim 2, wherein the graphite of each of the first block and the second block is coated with silicon carbide (SiC).

4. The reflectometer system of claim 1, wherein each of the first inner surface and the second inner surface is planar, and the second inner surface is parallel to the first inner surface.

5. The reflectometer system of claim 4, wherein an outer edge of the first connector bar, an outer edge of the second connector bar, a first curved outer surface of the first block, and a second curved outer surface of the second block together form a concentric circle.

6. The reflectometer system of claim 1, wherein the first connector bar is received in a first recess formed in the first inner surface and a first recess formed in the second inner surface, and the second connector bar is received in a second recess formed in the first inner surface and a second recess formed in the second inner surface.

7. The reflectometer system of claim 1, wherein the second block further comprises a coupon opening formed in the second inner surface, the light receiver comprises a transparent light collector disposed in the first block, and the reflectometer system further comprises a crystalline coupon disposed at least partially in the coupon opening, wherein the crystalline coupon is formed of silicon carbide (SiC).

8. The reflectometer system of claim 1, wherein the first block further comprises a coupon opening formed in the first inner surface, and the reflectometer system further comprises a crystalline coupon disposed at least partially in the coupon opening, wherein the crystalline coupon is formed of silicon carbide (SiC).

\* \* \* \* \*